Sept. 5, 1950 R. R. GANNAWAY ET AL 2,521,158

SAWTOOTH CURRENT GENERATOR

Filed May 4, 1946 3 Sheets-Sheet 1

Inventors
Robertson R. Gannaway
Stanley Zurakov
By Mueller and Mason
Attorneys

Inventors
Robertson R. Gannaway
Stanley Zurakov
By
Mueller and Mason
Attorneys

Sept. 5, 1950 R. R. GANNAWAY ET AL 2,521,158

SAWTOOTH CURRENT GENERATOR

Filed May 4, 1946 3 Sheets-Sheet 3

INVENTORS
Robertson R. Gannaway
Stanley Zurakov

BY Mueller and Mason
Attorneys

Patented Sept. 5, 1950 2,521,158

UNITED STATES PATENT OFFICE 2,521,158

SAWTOOTH CURRENT GENERATOR

Robertson R. Gannaway, Oak Park, and Stanley Zurakov, Chicago, Ill., assignors to Belmont Radio Corporation, Chicago, Ill., a corporation of Illinois Application May 4, 1946, Serial No. 667,305

23 Claims. (Cl. 315—27)

This invention relates generally to apparatus for producing a sawtooth current wave and in particular to an efficient oscillator for providing a sawtooth current in an inductive load as required for television scanning.

In the design of an oscillator for producing a sawtooth current in an inductive load, it is required that a constant voltage be applied across the load allowing the current to build up at a constant rate and then causing the current to suddenly fall and build up again in a second wave of the same shape. In such a circuit it is desired that as little power be used as possible, and to accomplish this, advantage must be taken of the energy stored in the inductive load during the time the current is building up in the load. Also for use as a scanning current generator in a television receiver, the oscillator must be arranged to receive a synchronization pulse to cause the current to drop at a predetermined instant.

In prior systems, increasing current has been produced in a load by use of a regenerative amplifier in which a transformer coupling is provided between the plate and grid circuits of the amplifier tube. Such an oscillator provides the desired wave form but consumes a large amount of energy as there is no utilization of the energy that is stored in the load during the building up of current therein. Also, systems have been devised in which the energy stored in the load is utilized but such systems have generally not provided the stable circuit condition required to provide a sawtooth wave form with a substantially linear increase of current and a very rapid return to the starting point as is required during the retrace in a television scanning system.

It is, therefore, an object of the present invention to provide a sawtooth oscillator or current generator which utilizes a minimum of energy and which will provide a sawtooth current wave form having a substantially linear rise.

It is a further object of this invention to provide an oscillator for producing sawtooth currents in an inductive load which provides a substantially constant voltage across the load during a part of the cycle allowing the current to increase at a constant rate and which provides a regenerative transient period at the end of the cycle during which the current in the load suddenly decreases and reverses.

It is a further object of this invention to provide a sawtooth oscillator for producing a sawtooth current in an inductive load including a transformer connected to said load, which utilizes the energy stored in the inductive load (including the transformer) at the time the current drops to contribute to the load current in the next cycle.

A feature of this invention is the provision of a scanning oscillator for providing current of sawtooth wave form in the deflecting coils of a television receiver in which a rectifier is used in the oscillator for providing degenerative action therein so that the output voltage of the oscillator is constant and the current in the deflecting coils rises linearly making a linearity control for the scanning oscillator unnecessary.

An additional feature of this invention is the provision of a scanning oscillator for a television receiver including an amplifier tube having a plate and grid, with the plate and grid coupled to the windings of a transformer to provide currents of sawtooth wave form therein, and a diode also connected to said transformer and arranged to allow the energy which is stored in the transformer during the trace period to flow through the diode and back to the power supply, thus conserving this energy and providing very high efficiency.

A further feature of this invention is the provision of a scanning oscillator for providing sawtooth current in the deflecting coils of a television receiver in which the natural frequency may be regulated to very closely approach the frequency of the synchronization pulses so that pulses of very small amplitude are sufficient to hold the oscillator in step therewith.

A still further feature of this invention is the provision of an oscillator for producing sawtooth currents in an inductive load including an amplifier tube having a plate and grid which are connected to the windings of a transformer to provide a regenerative action from the plate to the grid of the tube and a rectifier connected between the plate and grid of the tube providing a degenerative coupling therebetween, the degenerative coupling of the rectifier over-riding the regenerative action through the transformer to provide an equilibrium condition wherein the voltage across the load is substantially constant and the current is building up linearly with the tube automatically becoming blocked when a predetermined current is reached causing an oscillation in the transformer with the currents therein being reversed and the energy stored in the inductive load and the transformer being returned through the rectifier and substantially contributing to the total load current.

Further objects, features and advantages of this invention will be apparent from a consideration of the following description taken in connection with the accompanying drawings, in which.

In practicing our invention we provide a thermionic amplifier tube having the plate and grid circuits thereof coupled through the primary and secondary windings of a transformer in such a manner that regenerative action is provided. A diode is also connected between the plate and grid circuits of the amplifier tube forming a low resistance therebetween when the diode is conducting, thus providing degenerative action which over-rides the regenerative action. The number of turns and phasing of the transformer and the circuit constants are such that the cycle of the oscillator will include an equilibrium period and a regenerative transient period. During the equilibrium period, the voltage across the diode is such that the diode is conducting and the degenerative action thereof provides a substantially constant voltage across the load causing a substantially linearly increasing current therein. When the current increases to a predetermined value, current flow through the diode is cut off and the regenerative action takes over causing the voltage at the plate of the amplifier tube to increase very rapidly. The action of this increasing voltage through the transformer blocks the amplifier tube and allows the distributed capacitance of the transformer and the inductance of the load to oscillate freely, resulting in the load current decreasing and reversing. The changing current in the transformer results in the primary voltage rising rapidly to a very high peak, then falling again, allowing the diode to become conductive again starting another cycle. Means are also provided for impressing a synchronization voltage on the grid of the amplifier tube to block the tube prematurely terminating the rise of current and causing the capacitance of the transformer and the inductance of the load to freely oscillate.

Figure 1:
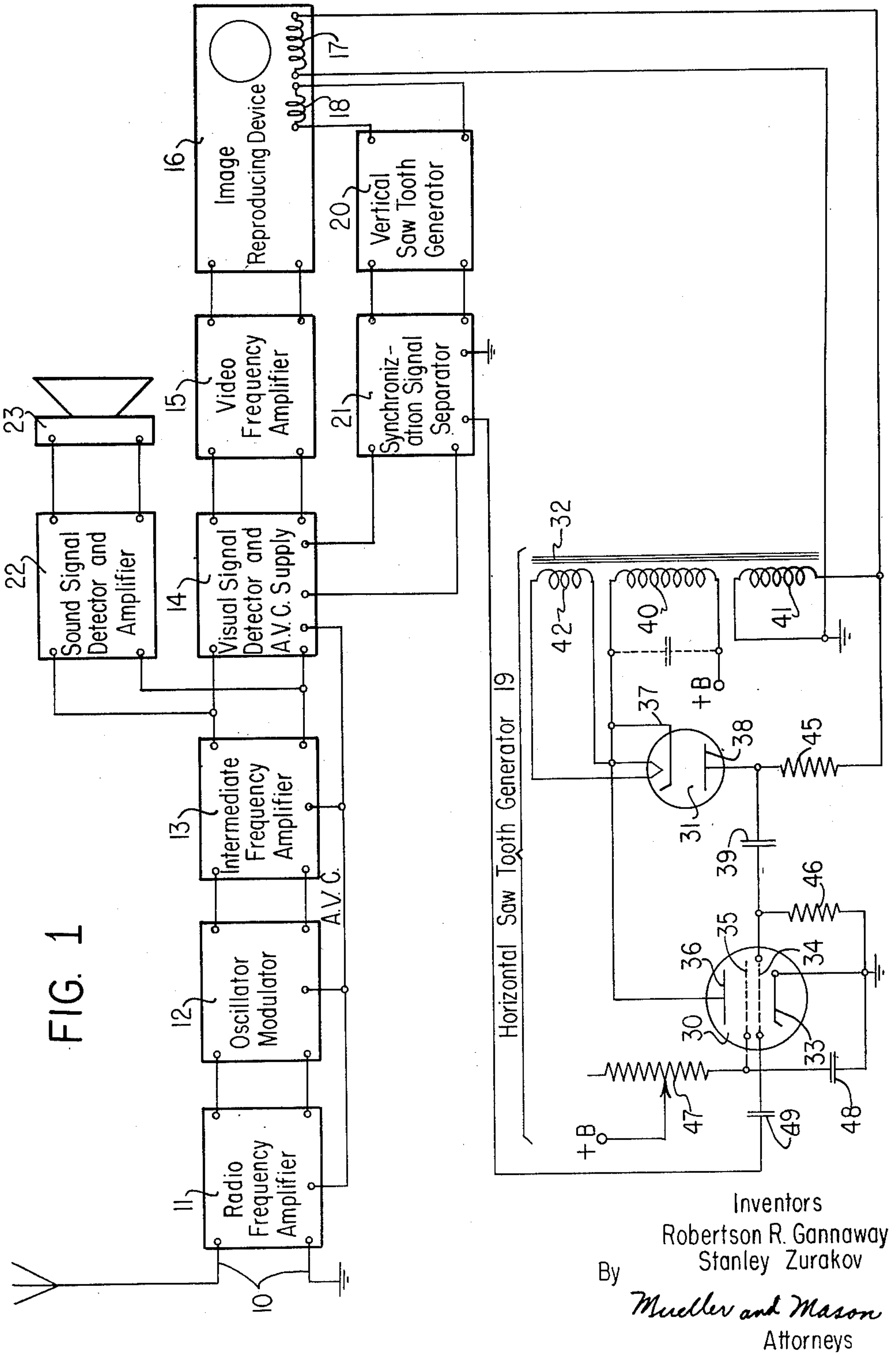
Fig. 1 is a schematical diagram of a television receiver utilizing the oscillator of this invention for producing horizontal deflections.

Referring now to the drawings, in Fig. 1 there is illustrated a receiver of the superheterodyne type including an antenna system 10 connected to a radio frequency amplifier 11 to which are connected the following; an oscillator-modulator 12, an intermediate frequency amplifier 13, a visual-signal detector and automatic volume control supply 14, a video frequency amplifier 15 and an image reproducing device 16. The image reproducing device includes horizontal deflecting coils 17 and vertical deflecting coils 18 for causing the scanning beam of the image reproducing device to scan the screen in a predetermined manner. The deflecting coils are connected respectively to a horizontal sawtooth generator 19 and a vertical sawtooth generator 20 each of which has an input circuit coupled to the output circuit of detector 14 through the synchronizing signal separator 21. A sound signal detector and amplifier 22 and a sound reproducing device 23 are coupled to the output circuit of the intermediate frequency amplifier 13. An automatic volume control voltage is derived from detector 14 and applied to one or more of the tubes of radio frequency amplifier 11, oscillator-modulator 12 and intermediate frequency amplifier 13 to maintain the amplitude of the signal input to the detectors 14 and 22 within relatively narrow limits while receiving signals of widely varying amplitudes. All of the units described with the exception of the horizontal sawtooth generator 19 may be of well known construction and accordingly a detailed illustration and description thereof is not given herein. The horizontal sawtooth generator 19 and the operation thereof will be described in detail hereafter.

Referring now briefly to the operation of the television system illustrated in Fig. 1, radio frequency television signals are intercepted by the antenna 10 and the signals of the desired frequency are amplified in radio frequency amplifier 11 and translated to the oscillator-modulator 12 wherein they are converted into intermediate frequency signals which are in turn selectively amplified in the intermediate frequency amplifier and from which they are delivered to the visual signal detector 14 and the sound signal detector 22. The visual modulation components of the signal are derived by the detector 14 and are amplified by the video frequency amplifier 15 and furnished to a control electrode of the image reproducing device 16. The synchronization signals are also derived by the detector 14 and furnished to the synchronization signal separator from which separate vertical and horizontal synchronization pulses are furnished respectively to the vertical sawtooth generator and the horizontal sawtooth generator which supply currents for the deflecting coils 17 and 18 of the image reproducing device. The intensity of the scanning beam of the device 16 is modulated in accordance with the video frequency voltages impressed upon its control electrode in a well known manner. Deflecting currents are produced by the vertical sawtooth generator 20 and horizontal sawtooth generator 19 which are controlled by the synchronization voltages from the synchronization signal separator and are applied to the deflecting coils 17 and 18 to produce magnetic fields to deflect the scanning beam in two directions perpendicular to each other so as to trace a rectilinear scanning operation on the screen and thereby reconstruct the image which was transmitted. Sound modulated signals derived from the intermediate frequency amplifier 13 are detected and amplified in unit 22 and reproduced in the sound reproducing device 23.

The horizontal sawtooth wave oscillator or generator 19 is illustrated in detail and includes a thermionic amplifier tube shown as a tetrode 30, connected to a diode 31, and a transformer 32. The amplifier tube includes a cathode 33, control grid 34, screen grid 35 and plate 36. Connected to the plate 36 of the tetrode is the cathode 37 of diode 31 and the plate 38 of the diode is coupled through capacitor 39 to the grid 34 of the tetrode. The transformer 32 has a primary winding 40 and a secondary winding 41, the primary winding 40 being connected between the plate of the tetrode and the diode cathode and a source of potential marked +B. The secondary winding 41 is connected in parallel with the horizontal scanning coil 17 which forms an inductive load. One side of the secondary and the load are connected to ground and the other side of the secondary and load are connected through a resistor 45 to the plate of the diode and coupled through the capacitor 39 to the grid of the amplifier tube. For the purpose of providing filament current for the diode an additional winding 42 is provided on the transformer 32. However, this arrangement is not essential and a separate source of filament current can be used. Resistor 46 is connected between the control grid 34 and ground to furnish the proper operating potential to the control grid. The control grid 34 is also connected through coupling condenser 49 to the synchronization signal separator 21. The screen grid 35 is connected to a source of potential marked +B through the variable resistor 47 and is grounded through by-pass condenser 48.

The connection of the windings of the transformer are such that, during the equilibrium period to be described, the total +B voltage is divided between the primary and secondary windings, except for the small drop across the diode 31 and the resistor 45. The polarities of the windings are such that regenerative action is provided from the plate to grid of the amplifier tube. In one embodiment of the invention, the ratio of primary turns to secondary turns is 3.6 to 1. Also, using a +B voltage source of 350 volts, the voltage across the secondary and the load is approximately 77 volts during the equilibrium condition and the voltage of the plate 36 is less than this. It is noted that the voltage on plate 36 is normally less than the +B voltage. It is seen that the diode 31 wil in such a case be conducting and provide a very low resistance between the plate and grid circuits of the tube 30 causing degenerative action which will over-ride the regenerative action due to the transformer coupling. This action results because the degenerative action is due to conductive coupling and is not reduced by the turns ratio as is the regenerative coupling through the transformer. The circuit will, therefore, during the equilibrium condition, produce a substantially constant voltage across the load 17 and since the load is almost entirely inductive the current therein will increase substantially linearly.

As the tetrode 30 and diode 31 are connected to the primary of the transformer in opposition, the current in the transformer will be the difference between the currents through these tubes. At the beginning of the cycle, energy stored in the transformer will cause the current to flow in the primary in a direction to feed current into the power supply +B, as will be described in detail later. Accordingly, the current through the diode will be greater than the current through the tetrode. Due to the degenerative action of the diode, the voltage across the load remains substantially constant, and the current in the load increases due to the constant voltage applied thereto. This results in a decrease in diode current which reduces the current through resistor 45 and in turn decreases the negative potential on the grid of the tetrode 30 causing an increase in plate current flow through this tube. The decrease in diode current and the increase in the tetrode plate current combine to provide an increase in current through the load causing the current to become less negative and then reverse and become positive. As the current through the load increases, the current in the diode continually decreases and eventually becomes zero and the degenerative action of the diode ceases. At this instant the regenerative action through the transformer on the tetrode takes over. The bias on the grid of the tetrode now stops decreasing as the current through resistor 45 is not changing and accordingly the current from the tetrode can no longer increase. The increasing load current will, therefore, cause the plate voltage to rise. As the plate voltage approaches +B, the load voltage will fall. The load voltage drives the grid of the tetrode negative causing the plate current to drop resulting in further increase in voltage across the primary winding of the transformer until the voltage of the plate is above +B and the load voltage becomes negative. This cuts off the tetrode in a rapid regenerative transient.

Figures 3, 4, 5:
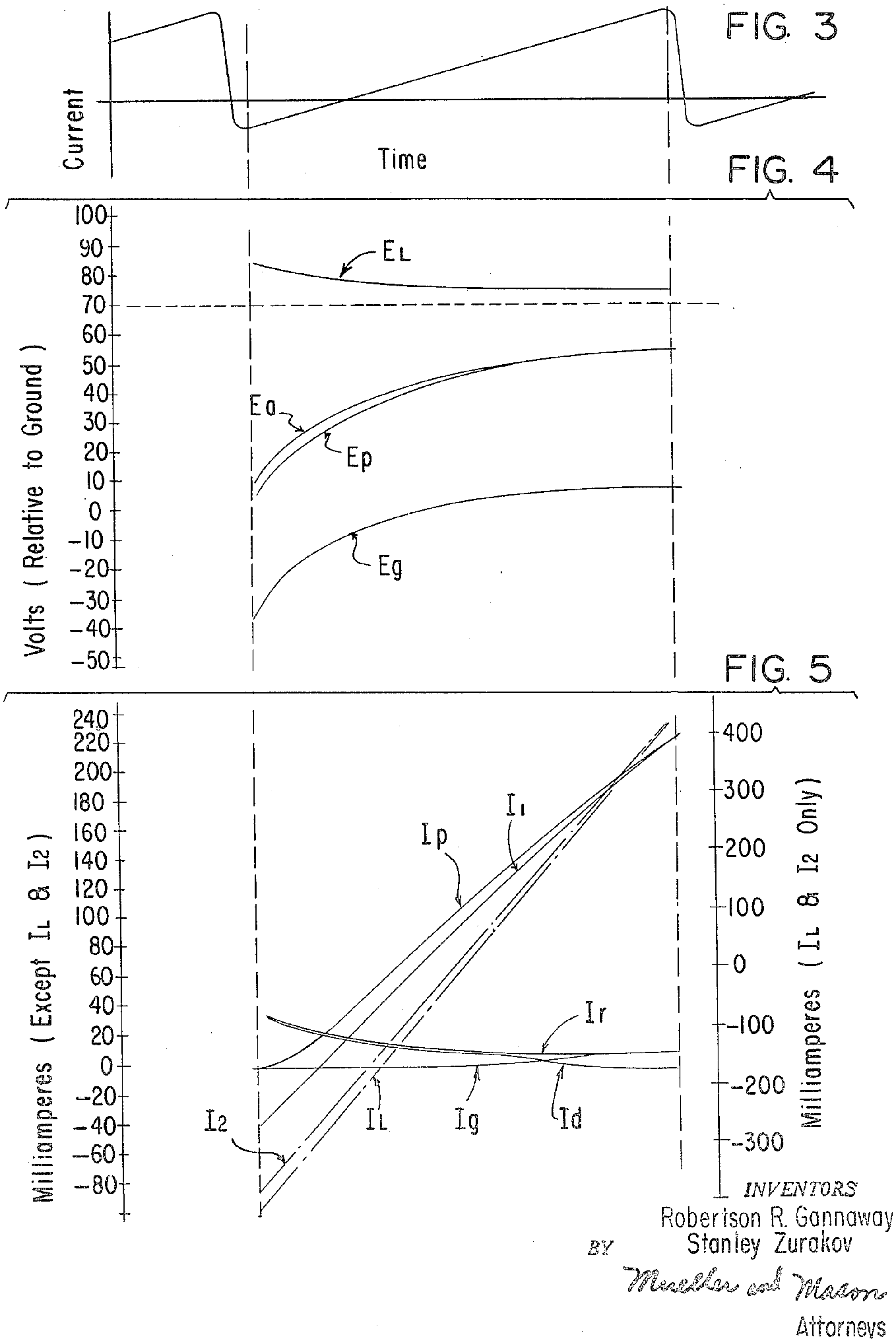
Fig. 3 illustrates the output current wave form of the oscillator.
Fig. 4 is a curve chart showing the relationship between the various voltages appearing in the oscillator during the equilibrium, or trace, period.
Fig. 5 is a chart similar to Fig. 4 showing the relationship between the currents flowing through various components of the oscillator.

The current in the primary of the transformer does not drop suddenly but instead the energy in the transformer flows into the effective capacitance of the circuit (mainly the distributed capacitance of the transformer primary). The effective capacitance of the circuit together with the load inductance reflected in the primary of the transformer form a resonant circuit and after the peak voltage is developed across the capacitance, the energy flows back into the inductance with reversed current polarity. As this energy transfer takes place, the voltage across the primary winding will fall and the load voltage will become positive. This causes the current to fall and reverse in a sinusoidal retrace period of one half cycle duration, as is illustrated in Fig. 3. The reduced primary voltage causes the diode to become conducting and the equilibrium condition to again be restored. Also at the end of the trace period a certain store of energy is available in the transformer and the inductive load, and after the retrace a portion of this energy is still available, the current in the inductive load now having been reversed. It is possible for the current to flow in the reverse direction as the diode is connected in the proper manner to provide a path for this reversed current. This current is in the wrong direction to flow through tetrode 30. Thus by allowing the current to reverse, the diode makes it possible to start a new trace period with a value of current which is initially negative. The current in the load remains negative for a considerable portion of the trace period. As long as the current is negative the inductive load is actually delivering energy to the power supply because the current is flowing in the direction opposite to that which would flow, for example, in a resistor connected across the power supply. Accordingly, the energy stored in the transformer and the inductive load at the end of the trace period will be effectively conserved, being fed back to the power supply during the first part of the equilibrium period when the current in the primary 40 is negative. As previously described, the diode current will decrease and the tetrode current increase to provide increasing load current.

As previously stated, at the beginning of the equilibrium condition the current in the diode is greater than the current in the tetrode and later the current in the tetrode becomes greater causing the current through the transformer primary 40 to reverse resulting in a wave form as is shown in Fig. 3. The maximum positive current is considerably greater than the maximum negative current as during the transient period a portion of the energy will be absorbed by the resistance of the windings and accordingly the current at the end of the oscillation during the transient period will be less than the current at the beginning of this period.

When the television receiver is operating, the horizontal synchronization pulses are separated in the unit 21 and amplified and applied to the horizontal saw-tooth generator through condenser 49 to the grid 34 of the amplifier tube. The action of these impulses will be to cause the grid 34 to suddenly become negative upsetting the equilibrium condition and causing the regenerative transient period to occur at a predetermined time rather than when the natural period occurs. As normally used in a television system, the natural or free-running period of the oscillator must be slightly longer than the interval between synchronization pulses so that the synchronization pulse will be applied to the grid 34 of the tetrode 30 just before the diode 31 is blocked, thus initiating the regenerative transient slightly ahead of the time when it would occur automatically. The natural period of the oscillator can be controlled by the variable resistor 47 as will be hereinafter explained. The operation of the oscillator upon receiving a synchronizing impulse is identical to that previously described and results in the energy stored in the transformer and load flowing through the diode back to the power supply during the first part of the equilibrium period.

Figure 2:
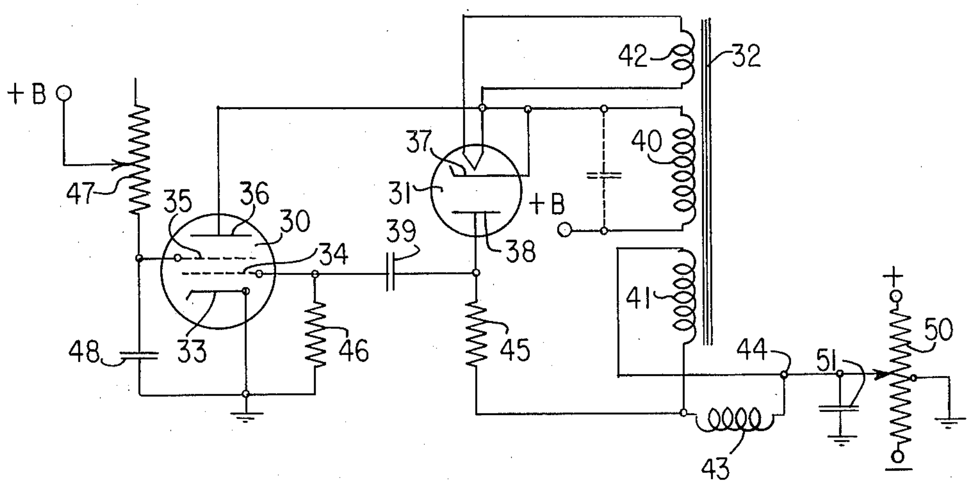
Fig. 2 is a circuit diagram of the oscillator similar to that shown in Fig. 1 but of more general application.

In Fig. 2 there is illustrated an oscillator similar to the oscillator 19 of Fig. 1 but modified in such a manner that it will be of more general application. As the amplifier tube, rectifier, and transformer are identical to the corresponding elements of the oscillator 19 and are connected in the same manner, the same reference characters are used as in Fig. 1. Instead of being illustrated in a television system, the oscillator is shown connected to a load 43 which may be any inductive load desired. The common connection between the secondary winding 41 of the transformer and the load 43, instead of being grounded as illustrated in Fig. 1, is connected to a point 44 which may be at ground potential or at a potential either above or below ground. The means for changing the potential of the point 44 is illustrated as a potentiometer resistor 50 having the ends thereof connected to a source of direct current and the center point grounded so that the movable contact may be at ground potential or at a potential either plus or minus with respect to ground. The condenser 51 or similar means must be utilized to furnish a low reactance path to ground. Any other suitable means may be used to provide the desired potential at point 44 in place of the arrangement illustrated.

Figure 6:
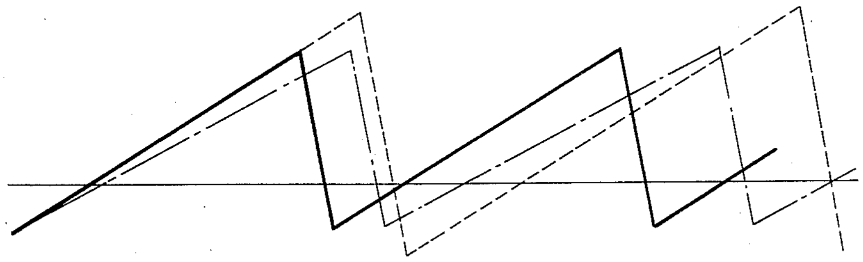
Fig. 6 is a curve chart showing the manner in which the current wave of the oscillator can be varied.

When the point 44 is at ground potential the operation of the oscillator is identical to that described with reference to Fig. 1. By changing the potential of point 44 the voltage across the transformer is correspondingly changed. The voltage across the primary and secondary coils of the transformer will, however, be divided in accordance with the turns ratio thereof regardless of the potential at the point 44. By applying a positive potential at point 44, for example, the voltage across the transformer coils will be decreased and, accordingly, the voltage across the secondary 41 will decrease. A decreased voltage across the secondary 41 will cause a smaller voltage across the load 43 producing a smaller rate of current rise in the coil. Referring to Fig. 6, using the solid wave form as a base, the dot-dash line shows the effect of making point 44 positive. As the current capabilities of the ssytem are not changed, the current will eventually reach the same maximum value as previously when a greater voltage was applied across the coil, therefore resulting in a slower frequency of oscillation. Conversely by applying a negative potential at point 44, the voltage across the transformer will be increased and the voltage applied to the load 43 similarly increased causing the current to rise more sharply and the frequency of the oscillator to be increased. It is to be noted that the peak amplitude of the current wave will not be changed by changing the potential at point 44 but that the slope of the current wave will be changed requiring greater or less time for the maximum current to be reached depending on whether a negative or positive voltage is applied. Thus, variation of the potential at point 44 provides control of the free-running frequency, with an incidental variation in the slope of the output current, the total amplitude being substantially constant.

By adjustment of the variable resistor 47, the potential at the screen grid 35 may be varied, causing a consequent variation in the current capability of the tetrode 30. This is not attended by a corresponding change in the output voltage during the equilibrium period, nor by an increase in the slope of the output current. Hence, for example, an increase of screen voltage increases the current capability thereby causing an increase in the time required to exhaust this capability and thus decreasing the free-running frequency of oscillation. This action is illustrated by the current wave shown by the broken line in Fig. 6. The variable resistor 47 thus provides control of the free-running frequency, with an incidental variation in the total amplitude of the output current, the slope being substantially constant.

In some applications, particularly in a television receiver, the sawtooth current generator operates under a condition of synchronization. Although a frequency control may be necessary to insure that synchronization is effected, it does not actually change the frequency when it is varied over the limited range for which the oscillator remains in synchronism. Control by means of the potential at point 44 will, however, vary the output voltage and hence the slope of the output current. The frequency being fixed when the oscillator is synchronized, this produces a change in total current amplitude. In contrast, if the resistor 47 is used as a frequency or synchronization control, the output voltage is not affected, nor is the slope of the output current. The frequency being likewise fixed, the total current amplitude is constant. For this reason, in most applications where synchronized operation is desired, such as in a television receiver, the latter type of control is preferred and means for varying the potential at point 44 is not required.

Figs. 4 and 5 show the manner in which the voltages and currents change during the equilibrium period, the various curves being designated as follows:

*Fig. 4*

E1—Load voltage (voltage at hot side of coil 17)
Ea—Voltage on plate 38 of diode 31
Eg—Voltage on grid 34 of tetrode (differs from Ea by substantially constant voltage across condenser 39)
Ep—Voltage on plate 35 of tetrode 30 and cathode 37 of diode 31.

*Fig. 5*

IL—Current in load
I2—Current in secondary of transformer
I1—Current in primary of transformer
Ip—Plate current of tetrode 30
Id—Current through diode 31
Ir—Current through resistance 45
Ig—Grid current of tetrode 30

Figs. 3, 4 and 5 have the same time base to facilitate comparison of the three figures.

The circuit constants of an oscillator which was built and operated satisfactorily and in which the voltages and currents were as shown in Figs. 4 and 5 are as follows:

Tube 30, two 7C5's in parallel
Tube 31, 6AL5 (sections in parallel)
Transformer 32, special transformer (primary 360 turns, secondary 100 turns) (leakage inductance at secondary—approx. 500 microhenries) (primary inductance approx. 400 millihenries)
Coil 17, standard television yoke—5 millihenries, 18 ohms
Resistance 45, 2,000 ohms
Resistance 46, 20,000 ohms
Capacitor 39, .1 microfarad
Capacitor 48, .5 microfarad
Resistance 47, adjustable—approx. 8500 ohms
Capacitor 49, 50 micromicrofarads
B voltage, 350 volts Resistor 47 is adjusted to set screen voltage for proper current capability of tetrode. This effectively sets the free-running operating frequency of the oscillator. Under operating conditions the screen voltage was 170 volts and the current was 22 milliamperes (two tubes). The input electrodes of the two sections of the 6AL5 tube were immersed in oil to set up a high dielectric between them to prevent arcing which would occur at the frequencies and voltages used.

Although the value of resistor 45 is not critical for satisfactory operation of the circuit, to provide current contribution through the diode and a transfer of energy back to the power supply as above described the resistance must be comparatively low so that the diode will conduct all of the reversed primary current. It should not be so low that the diode current is excessive, as in such case the excess current would flow through the tetrode to ground. A triode of suitable characteristics can be used instead of the tetrode 30 but the tetrode is preferable.

From the above it is seen that we provide an oscillator for providing sawtooth currents in an inductive load such as a cathode ray tube deflecting coil having a stable equilibrium condition while the current is building up in the load and a regenerative transient period during which the current in the load reduces very suddenly and reverses. The circuit further provides means for conserving energy which is stored in the load at the end of this period, thereby providing very efficient operation. The circuit is comparatively simple and utilizes standard components.

Although we have described what is considered the preferred embodiment of our invention, it is apparent that various changes and modifications can be made therein without departing from the intended scope of the invention as defined in the appended claims.

We claim:

1. An oscillator for producing a current of sawtooth wave form in an inductive load, comprising an electron discharge valve having a plate and a grid, a rectifier, and a transformer adapted to be connected to said load, said rectifier being coupled to said discharge valve to provide degenerative action between the plate and grid thereof producing a stable equilibrium condition in said oscillator, said transformer being connected between the plate and grid of said discharge valve providing regenerative action therebetween, said discharge valve and said rectifier contributing to the current building up in said load, said rectifier being blocked when a predetermined current is reached causing a rapid regenerative transient which also blocks said discharge valve and permits the inductance of the load and the distributed capacitance of the transformer windings to oscillate freely through a half cycle causing the current in said load to drop very suddenly and reverse.

2. An oscillator for producing a current of sawtooth wave form in an inductive load, comprising a thermionic amplifier tube, a diode, and a transformer adapted to be connected to said load, said diode being coupled to said amplifier tube to provide degenerative action between the plate and grid thereof producing a stable equilibrium condition in said oscillator, said transformer being coupled to said plate and grid of said amplifier tube providing regenerative action therebetween, said amplifier tube and said diode contributing to the current building up in said load, said diode being blocked when a predetermined current is reached causing a rapid regenerative transient which also blocks said amplifier tube and permits the inductance of the load and the distributed capacitance of the transformer windings to oscillate freely through a half cycle causing the current in said load to drop very suddenly and reverse, said diode again becoming conductive when said current in said load has reversed to cause said stable equilibrium condition to exist and said current to again build up in said load.

3. A sawtooth current generator comprising an electron discharge valve having at least a plate and a grid, a transformer having primary and secondary windings, a rectifier, a resistor and a capacitor, said primary winding being connected to said plate and said secondary winding being connected through said resistor and said capacitor to said grid of said discharge valve, said primary and secondary coils being proportioned and phased to provide regenerative action from said plate to said grid of said discharge valve and said rectifier being coupled to said plate and said grid to provide degenerative action therebetween.

4. An oscillator for providing current of sawtooth wave form in an inductive load, comprising an electron discharge valve having at least a plate and a grid, a rectifier, and a transformer adapted to be connected to said load, said plate and grid of said discharge valve being coupled through the windings of said transformer to provide regenerative action from said plate to said grid, said rectifier being coupled to said discharge valve to provide degenerative action between said plate and said grid thereof.

5. An oscillator for producing current of saw-tooth wave form in an inductive load comprising an electron discharge valve having at least a plate and a grid, a rectifier, and means coupled to said discharge valve to provide a regenerative action from said plate to said grid thereof, said rectifier also being coupled to said discharge valve to provide a degenerative action between said plate and said grid, said degenerative action over-riding said regenerative action when said rectifier is conducting to provide a stable equilibrium condition in said oscillator.

6. An oscillator for providing current of saw-tooth wave form in an inductive load, comprising a thermionic amplifier tube having at least a plate and grid, a rectifier, and a transformer to be connected to said load, said plate and grid of said amplifier tube being coupled through the windings of said transformer to provide regenerative action from said plate to said grid, and said rectifier being coupled to said plate and grid of said tube to provide degenerative action which over-rides the regenerative action of said transformer coupling, with the current through said amplifier tube combining with the current through said rectifier to provide a current through said load increasing substantially linearly with time, said current through said rectifier contributing substantially to the total load current.

7. An oscillator for producing current of saw-tooth wave form in an inductive load, comprising a thermionic amplifier tube having at least a plate and a grid, a rectifier, and a transformer adapted to be connected to said load, said plate and grid of said amplifier tube being coupled through the windings of said transformer to provide regenerative action from said plate to said grid, said rectifier being coupled to said amplifier tube to form a low resistance degenerative coupling between said plate and grid thereof over-riding the regenerative action through said transformer to provide stable operation of said oscillator with a substantially constant voltage being applied across the load and with the current in said rectifier and the current in said amplifier tube combining to provide a substantially linearly increasing current in said load.

8. An oscillator for producing current of saw-tooth wave form in an inductive load, comprising a thermionic amplifier tube having at least a plate and a grid, a diode, and a transformer adapted to be connected to said load, said plate and grid of said amplifier tube being coupled through the windings of said transformer to provide regenerative action from said plate to said grid, said diode being coupled to said amplifier tube forming a low resistance degenerative action between said plate and grid thereof which over-rides the regenerative action through said transformer to provide stable operation of said oscillator with a substantially constant voltage being applied across the load and with the current in said diode and the current in said amplifier tube combining to provide a substantially linearly increasing current in said load, said diode being blocked when the current in said load reaches a predetermined value causing said regenerative action to control said amplifier tube.

9. An oscillator for producing current of saw-tooth wave form in an inductive load, comprising a thermionic amplifier tube having at least a plate and a grid, a rectifier, a transformer adapted to be connected to said load, said plate and grid of said amplifier tube being coupled through the windings of said transformer to provide regenerative action from said plate to said grid, said rectifier being coupled to said amplifier tube forming a low resistance degenerative coupling between said plate and grid thereof over-riding the regenerative action through said transformer to provide stable operation of said oscillator with a substantially constant voltage being applied across the load and with the current in said rectifier and the current in said amplifier tube combining to provide a substantially linearly increasing current in said load, and means for blocking said amplifier tube permitting the inductance of said load and the distributed capacitance of said transformer windings to oscillate freely causing the current in said load to drop very suddenly and reverse.

10. An oscillator for producing current of saw-tooth wave form in an inductive load comprising a thermionic amplifier tube having at least a plate and a grid, a rectifier, a transformer adapted to be connected to said load, said plate and grid of said amplifier tube being coupled through the windings of said transformer to provide degenerative action from said plate to said grid, said rectifier being coupled to said amplifier tube forming a low resistance degenerative coupling between said plate and grid thereof over-riding the regenerative action from said transformer to provide stable operation of said oscillator with a substantially constant voltage being applied across the load to provide a substantially linearly increasing current in said load until a predetermined current is reached when the amplifier tube is blocked and the inductance of said load and the distributed capacitance of said transformer oscillate freely causing the current in said load to drop very suddenly thus providing a natural period for said oscillator, and means for applying a synchronization pulse to said oscillator for blocking said amplifier prior to said natural period.

11. An oscillator for producing current of saw-tooth wave form in an inductive load comprising a thermionic amplifier tube having at least a plate and a grid, a rectifier, a transformer adapted to be connected to said load, said plate and grid of said amplifier tube being coupled through the windings of said transformer to provide degenerative action from said plate to said grid, said rectifier being coupled to said amplifier tube forming a low resistance degenerative coupling between said plate and grid thereof over-riding the regenerative action from said transformer to provide stable operation of said oscillator with a substantially constant voltage being applied across the load to provide a substantially linearly increasing current in said load until a predetermined current is reached when the amplifier tube is blocked and the inductance of said load and the distributed capacitance of said transformer oscillate freely causing the current in said load to drop very suddenly thus providing a natural period for said oscillator, and means for applying a synchronization pulse to said oscillator for blocking said amplifier prior to said natural period, said natural period of said oscillator being sufficiently close to the frequency of said synchronization pulses so that a pulse of small magnitude is sufficient to block said amplifier tube.

12. An oscillator for producing a current of sawtooth wave form in an inductive load, comprising a thermionic amplifier tube, a diode, and a transformer adapted to be connected to said load, said diode being coupled to said amplifier tube to provide degenerative action between the plate and grid thereof producing a stable equilibrium condition in said oscillator, said transformer being coupled to said plate and grid of said amplifier tube providing regenerative action therebetween, said amplifier tube and said diode both contributing to the current in said load until a predetermined current is reached when said diode is blocked causing a rapid regenerative transient which also blocks said amplifier tube and permits the inductance of the load and the distributed capacitance of the transformer windings to oscillate freely through a half cycle causing the current in said load to drop suddenly and reverse, said diode again becoming conductive when said current in said load has reversed with said degenerative action controlling said oscillator and the energy stored in said transformer and load previous to said sudden change in current therein flowing through said diode to contribute to said load current.

13. An oscillator for producing current of sawtooth wave form in an inductive load comprising thermionic amplifier tube having at least a plate and a grid, a rectifier, a transformer adapted to be connected to said load, said plate and grid of said amplifier tube being coupled through the windings of said transformer to provide regenerative action from said plate to said grid, said rectifier being coupled to said amplifier tube forming a low resistance degenerative coupling between said plate and grid thereof over-riding the regenerative action through said transformer to provide stable operation of said oscillator with a substantially constant voltage being applied across the load and with the current in said rectifier and the current in said amplifier tube combining to provide a substantially linearly increasing current in said load, means for blocking said amplifier tube permitting the inductance of said load and the distributed capacitance of said transformer windings to oscillate freely causing the current in said load to drop very suddenly and reverse, said reversed current causing said degenerative stable operation to be restored with the energy stored in said transformer and load during the increase of current therein flowing through said rectifier to contribute to the load current.

14. An oscillator for producing current of sawtooth wave form in an inductive load, comprising a thermionic amplifier tube having at least a plate and grid, a diode, a transformer having primary and secondary windings, a resistor and a capacitor, said diode being coupled to said amplifier tube to provide a low resistance between the plate and grid thereof forming a degenerative coupling, said primary winding of said transformer being connected to said plate and said secondary winding of said transformer being connected through said resistor and said capacitor to said grid to provide a regenerative coupling from said plate to said grid of said amplifier tube, the degenerative action of said diode being arranged to over-ride the regenerative action of said transformer coupling when said diode is conducting providing an equilibrium condition resulting in a substantially constant voltage across said secondary winding for application to the inductive load with the current through said amplifier tube and the current through said diode combining to produce a linearly increasing current in said load.

15. An oscillator for producing current of sawtooth wave form in an inductive load, comprising a thermionic amplifier tube having at least a plate and grid, a rectifier, a transformer having primary and secondary windings, and a resistor, said rectifier being coupled to said amplifier tube to provide a low resistance degenerative coupling between the plate and grid thereof, said primary winding of said transformer being connected to said plate and said secondary winding of said transformer being coupled through said resistor to said grid to provide a regenerative coupling from said plate to said grid of said amplifier tube, the degenerative action of said rectifier being arranged to over-ride the regenerative action of said transformer coupling when said rectifier is conducting providing an equilibrium condition resulting in a substantially constant voltage in the secondary winding for application to the inductive load with the current through said amplifier tube and the current through said rectifier combining to produce a linearly increasing current in said load, the value of said resistor being such that the current through the rectifier contributes substantially to the total load current.

16. An oscillator for producing current of sawtooth wave form in an inductive load, comprising a thermionic amplifier tube having at least a plate and grid, a rectifier, a transformer having primary and secondary windings, a resistor and a capacitor, said rectifier being coupled to said amplifier tube to provide a low resistance degenerative coupling between the plate and grid thereof, said primary winding of said transformer being connected to said plate and said secondary winding of said transformer being connected through said resistor and said capacitor to said grid to provide a regenerative coupling from said plate to said grid of said amplifier tube, the degenerative action of said rectifier coupling being arranged to over-ride the regenerative action of said transformer coupling when said rectifier is conducting providing an equilibrium condition resulting in a substantially constant voltage in the secondary winding for application to the inductive load to produce a linearly increasing current therein, the value of said resistance being such that the current through the rectifier contributes substantially to the total load current, said rectifier current decreasing as said load current increases and finally becoming zero thereby removing the degenerative coupling between the plate and grid of said amplifier tube and permitting said regenerative coupling to take over producing a regenerative transient condition in which the current in the load drops very suddenly.

17. An oscillator for producing current of sawtooth wave form in an inductive load, comprising an electronic discharge valve having at least a plate and a grid, a rectifier, a transformer adapted to be connected to said load, said amplifier tube being coupled through the windings of said transformer to provide regenerative action from said plate to said grid, said rectifier being coupled to said amplifier tube to provide a low resistance degenerative coupling between said plate and grid over-riding the regenerative action through said transformer to provide a substantially constant voltage across the load which produces a substantially linearly increasing current therein, and means for changing the magnitude of the voltage applied to said load.

18. An oscillator for producing current of sawtooth wave form in an inductive load, comprising a thermionic amplifier tube having a plate and a grid, a rectifier, a transformer having primary and secondary windings, a resistor, a capacitor, said rectifier being coupled to said amplifier tube to provide a low resistance degenerative coupling between the plate and grid thereof, said primary winding of said transformer being connected to said plate and said secondary winding of said transformer being connected through said resistor and said capacitor to said grid to provide a regenerative coupling from said plate to said grid of said amplifier tube, the degenerative action of said rectifier coupling being arranged to override the regenerative action of said transformer coupling when said rectifier is conducting providing an equilibrium condition resulting in a substantially constant voltage across the secondary winding for application to the inductive load to produce a linearly increasing current therein, and means for changing the voltage across the secondary winding whereby the rate at which the current in the load increases is changed.

19. An oscillator for producing current of sawtooth wave form in an inductive load, comprising a thermionic amplifier tube having at least a plate and a grid, a rectifier, and a transformer adapted to be connected to said load, said plate and said grid of said amplifier tube being coupled through the windings of said transformer to provide regenerative action therebetween, said rectifier being coupled to said amplifier tube forming a low resistance degenerative coupling between the plate and grid thereof which over-rides the regenerative action through said transformer to provide stable operation of said oscillator with a substantially constant voltage being applied to said load, the current through said rectifier and the current through said amplifier tube combining to provide a substantially linearly increasing current in said load until a predetermined current value is reached, and means for changing the voltage applied across said load whereby the rate at which the current increases is changed and the time required for said predetermined current to flow is varied 20. An oscillator for producing current of sawtooth wave form in an inductive load comprising a thermionic amplifier tube having a plate, a control grid, and a screen grid, a rectifier, a transformer adapted to be connected to said load, and means for applying a voltage to said screen grid, said plate and said control grid of said amplifier tube being coupled through the windings of said transformer to provide regenerative action therebetween, said rectifier being coupled to said amplifier tube forming a low resistance degenerative coupling between said plate and said control grid thereof which over-rides the regenerative action through said transformer, the current through said amplifier tube and the current through said rectifier combining to provide increasing current in said load until a predetermined current is reached when said rectifier is blocked and the maximum current capacity of said amplifier tube is reached causing said amplifier tube to be blocked and said transformer and load to oscillate, the amount of voltage applied to said screen grid controlling the maximum current capacity of said amplifier tube to thereby control the magnitude of said load current and the natural period of said oscillator.

21. An oscillator for producing current of sawtooth wave form in an inductive load comprising a thermionic amplifier tube having a plate, a control grid, and a screen grid, a rectifier, a transformer adapted to be connected to said load, means for applying a voltage to said screen grid, said plate and said control grid of said amplifier tube being coupled through the windings of said transformer to provide regenerative action therebetween, said rectifier being coupled to said amplifier tube forming a low resistance degenerative coupling between said plate and said control grid thereof which over-rides the regenerative action through said transformer, the current through said amplifier tube and the current through said rectifier combining to provide increasing current in said load until a predetermined current is reached when said rectifier is blocked and the maximum current capacity of said amplifier tube is reached causing said amplifier tube to be blocked and said transformer and load to oscillate, and means for varying the amount of voltage applied to said screen grid to change the current capacity of said amplifier tube and thereby change the magnitude of said load current and the natural period of said oscillator.

22. In a television receiver including an image reproducing device having a scanning beam and deflecting coils for providing a magnetic field for deflecting said scanning beam, an oscillator for producing current of sawtooth wave form in said deflecting coil comprising a thermionic amplifier tube having at least a plate and a grid, a rectifier, a transformer having primary and secondary windings, said rectifier being coupled to said amplifier tube to provide a low resistance degenerative coupling between the plate and grid thereof, said primary winding of said transformer being connected to said plate and said secondary winding of said transformer being coupled to said grid to provide regenerative action therebetween, said deflecting coil being connected across said secondary winding of said transformer, the degenerative action of said rectifier being arranged to over-ride the regenerative action of said transformer coupling when said rectifier is conducting providing an equilibrium condition resulting in a substantially constant voltage across said secondary winding and across said deflecting coils which produces a substantially linearly increasing current in said coils.

23. In a television receiving system the combination of an image reproducing device having magnetic deflecting coils, a generator for producing current of sawtooth wave form in said deflecting coils, and means for applying synchronization pulses to said generator to hold said current wave in step therewith; said generator comprising a thermionic amplifier tube having at least a plate and grid, a rectifier, and a transformer having primary and secondary windings, said plate and grid of said amplifier tube being coupled to said primary and secondary windings of said transformer respectively to provide regenerative action from said plate to said grid, said secondary winding of said transformer being connected to said deflecting coils, said rectifier being coupled to said amplifier tube to provide a degenerative action between said plate and said grid which is adapted to over-ride the regenerative action through said transformer to provide a substantially constant voltage across said deflecting coils providing a substantially linearly increasing current therein and means for applying said synchronization pulses to said amplifier tube for blocking said tube and permitting the inductance of said deflecting coils and the distributed capacitance of said transformer windings to oscillate freely causing the current in said deflecting coils to drop very suddenly.

ROBERTSON R. GANNAWAY.
STANLEY ZURAKOV.

REFERENCES CITED

The following references are of record in the file of this patent:

UNITED STATES PATENTS

| Number | Name | Date |
|---|---|---|
| 2,268,872 | Hewlett | Jan. 6, 1942 |
| 2,394,018 | Shank et al. | Feb. 5, 1946 |
| 2,440,786 | Schade | May 4, 1948 |
| 2,440,895 | Cawein | May 4, 1948 |